United States Patent [19]

Ohishi et al.

[11] Patent Number: 5,633,635
[45] Date of Patent: May 27, 1997

[54] METHOD OF PROCESSING CODE FOR ERROR CHECKING AND CODE PROCESSING CIRCUIT

[75] Inventors: Takeo Ohishi, Yokohama; Seiji Higurashi, Tokyo, both of Japan

[73] Assignee: Victor Company of Japan, Ltd., Japan

[21] Appl. No.: 310,766

[22] Filed: Sep. 27, 1994

[30] Foreign Application Priority Data

Sep. 30, 1993 [JP] Japan ................................. 5-268440

[51] Int. Cl.$^6$ .................................................. H03M 13/00
[52] U.S. Cl. ...................................... 341/94; 371/37.4
[58] Field of Search ........................... 341/94; 371/37.7, 371/37.1, 41, 37.4

[56] References Cited

U.S. PATENT DOCUMENTS

| | | | |
|---|---|---|---|
| 4,964,128 | 10/1990 | Sako et al. | 371/39.1 |
| 4,972,417 | 11/1990 | Sako et al. | 371/37.4 |
| 4,975,915 | 12/1990 | Sako et al. | 371/37.4 |
| 5,247,396 | 9/1993 | Nagai et al. | 360/8 |

FOREIGN PATENT DOCUMENTS 0514152  11/1992  European Pat. Off. .

*Primary Examiner*—Todd DeBoer
*Attorney, Agent, or Firm*—Rossi & Associates

[57] ABSTRACT

A method of generating codes for error checking from a first and second types of data trains, first type of data trains having m symbols, second type of data trains having n symbols, m and n being natural numbers and m<n, comprising the steps of: generating n-m dummy data: and attaching the n-m dummy data to the first types of data train is disclosed. Moreover, a code generating circuit for error checking from a first and second types of data trains, the first type of data train having m symbols, the second type of data train having n symbols, m and n being natural numbers and m<n, the first and second types of data train being supplied in a first and second modes respectively, comprises: a data generating circuit for generating n-m dummy data in the first mode; and a data processing circuit for outputting the second type of data train serially in the second mode, for attaching the n-m dummy data to the first types of data train, and outputting the first type of data train and the n-m dummy data serially in the first mode.

5 Claims, 9 Drawing Sheets

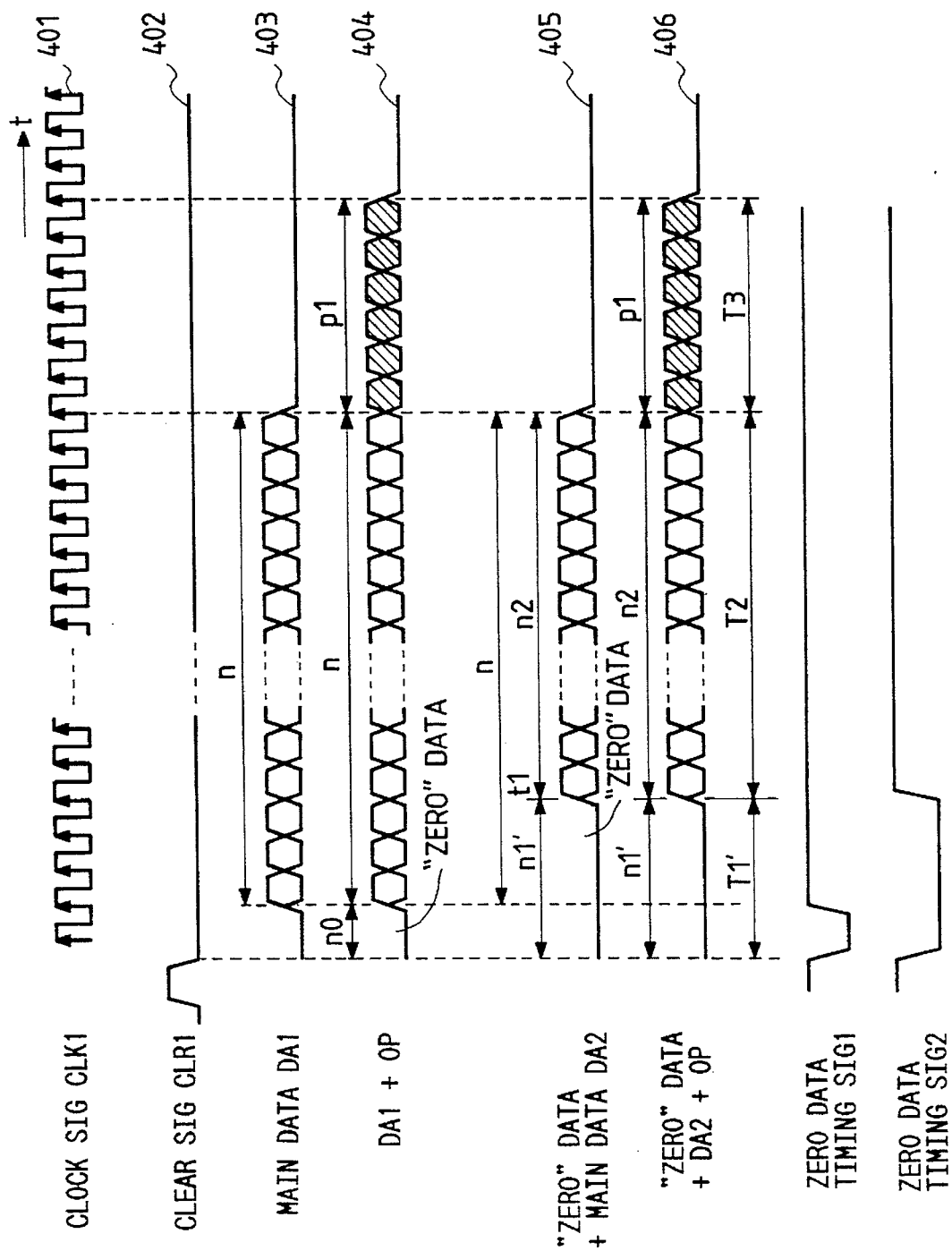

METHOD OF PROCESSING CODE FOR ERROR CHECKING AND CODE PROCESSING CIRCUIT

BACKGROUND OF THE INVENTION

1. Field of the Invention

This invention relates to a method of processing code for error checking and a code processing circuit for processing codes for error checking.

2. Description of the Prior Art

As a method of error detection in data transferring, the odd-even check is known. Such a prior art error detection method detects certain kinds of errors in which an extra bit, carried along with each word, is set to zero or one so that the total number of zeros or ones in each word is always made even or always made odd. This is also known as the parity check.

SUMMARY OF THE INVENTION

It is an object of this invention to provide an improved method of processing code for error checking.

It is also an object of this invention to provide an improved code processing circuit for processing codes for error checking.

According to the present invention there is provided a method of generating codes for error checking from a first and second types of data trains, first type of data trains having m symbols, second type of data trains having n symbols, n and m being natural numbers and m<n, comprising the steps of: generating m-n predetermined dummy data; and attaching the m-n predetermined dummy data to the first types of data train.

According to the present invention there is further provided a method of generating codes for error checking from a first and second types of data trains forming a format for recording said first and second types of data trains, first type of data trains having m symbols, second type of data trains having n symbols, m and n being natural numbers and m<n, comprising the steps of: generating n-m predetermined dummy data; and attaching said n-m predetermined dummy data to said first types of data train.

Each of the above-mentioned methods of generating codes, may further comprises: the step of: replacing said predetermined dummy data with predetermined data.

According to the present invention there is also provided a method of generating codes for error checking from a first and second types of data trains, first type of data trains having m symbols, second type of data trains having n symbols, m and n being natural number and different each other, comprising the steps of: generating first dummy data; generating second dummy data; attaching the first dummy data to the first type of data train; and attaching the second dummy data to the second types of data train, the first and second dummy data being generated such that a first data length of the first types of data train and the second dummy data being equal to a second data length of the second type of data train and second dummy data.

According to the present invention there is further provided a code generating circuit for error checking from first and second types of data trains, the first type of data train having m symbols, the second type of data train having n symbols, m and n being natural numbers and m<n, the first type of data train being supplied in a first mode, the second type of data train being supplied in a second mode, comprising: a data generating circuit for generating n-m predetermined dummy data in the first mode; and a data processing circuit for outputting the second type of data train serially in the second mode, for attaching the n-m predetermined dummy data to the first type of data train, and outputting the first type of data train and the n-m predetermined dummy data serially in the first mode.

BRIEF DESCRIPTION OF THE DRAWINGS

The object and features of the present invention will become more readily apparent from the following detailed description taken in conjunction with the accompanying drawings in which:

FIG. 10 is a timing chart of a modification of this embodiment showing waveforms of signals for producing a data train of the main data and parity data following the main data The same or corresponding elements or parts are designated as like references throughout the drawings.

DETAILED DESCRIPTION OF THE INVENTION

Hereinbelow will be described an embodiment of this invention.

Figures 4A, 4B:
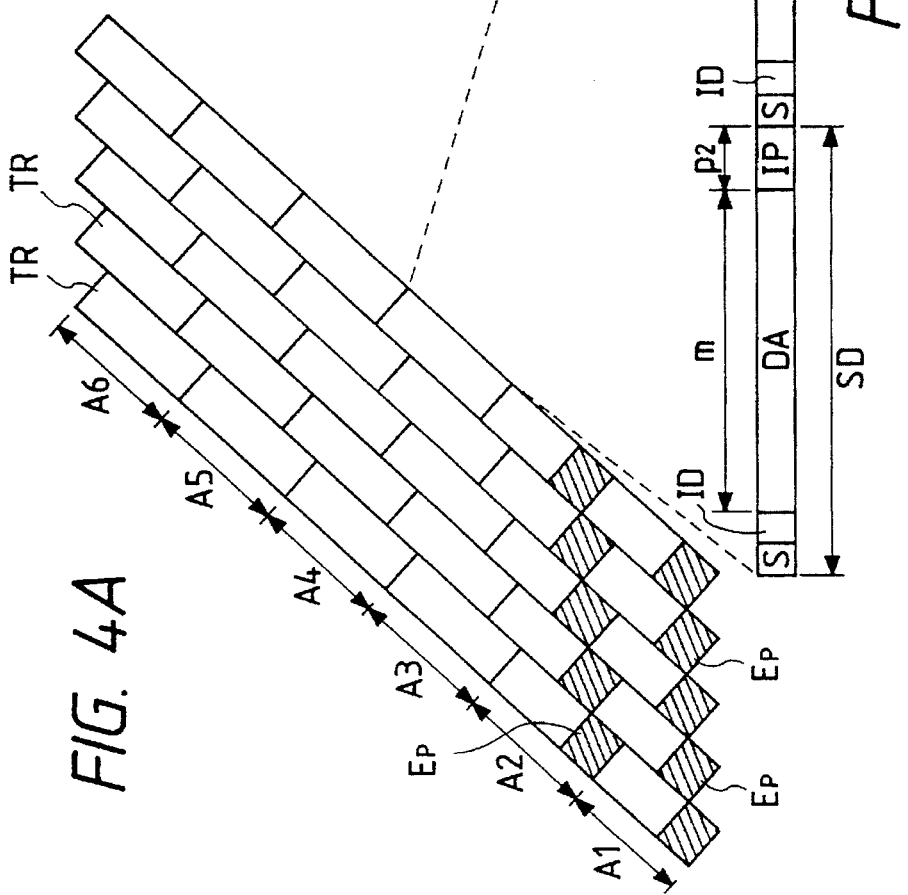
FIG. 4A is an illustration of this embodiment of this invention showing a tape format.
FIG. 4B is an illustration of this embodiment showing a serially recorded data.

FIG. 4A is an illustration of this embodiment of this invention showing a tape format. One track TR is divided into six recording regions A1 to A6. It is assumed that one sixth of the data recorded on a track TR is assigned to an audio signal and five sixths of the data recorded on the track TR are assigned to a video signal. More specifically, the recording region A1 is assigned to the audio signal and the recording regions A2 to A6 are assigned to the video signal.

Moreover, if it is necessary to rewrite the data at these regions A1 and A2 separately, preamble portions (or IBG) EP are provided to portions of the recording regions A1 and A2. However, if it is unnecessary to rewrite these recording regions A1 an A2 separately, a preamble is provided to the former recording region A1. In the example shown in the drawing, the preambles EP are provided to the recording regions A1 and A2, the recording region A2 includes an IBG (Inter Block Gap).

Figure 5A:
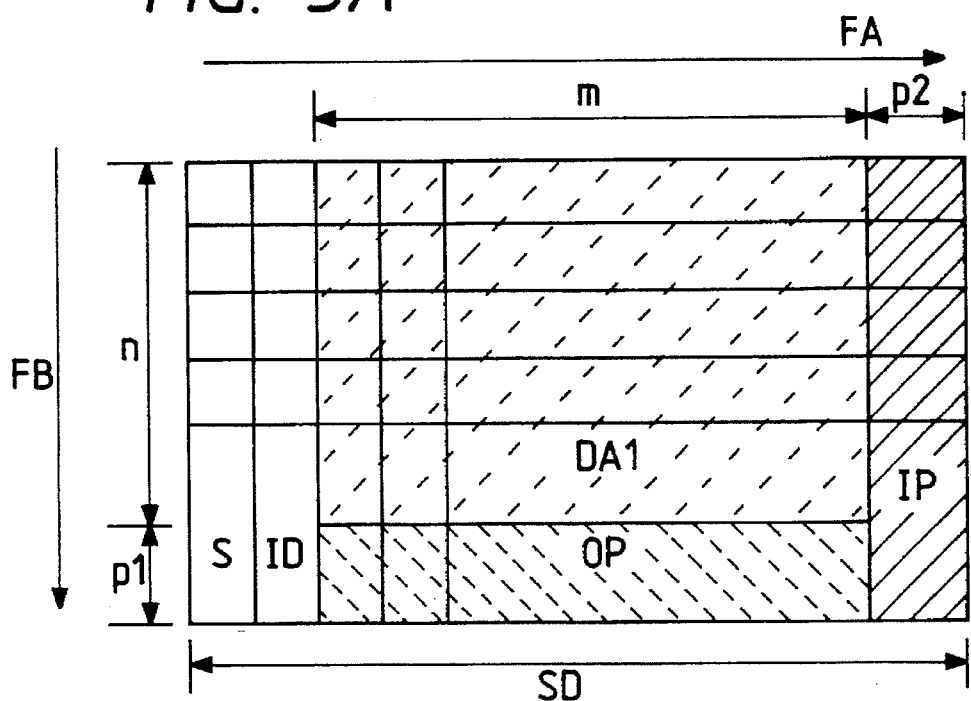
FIG. 5A is an illustration of this embodiment showing a format of a data block in the case that there is no preamble.

FIG. 5A is an illustration of this embodiment showing a format of a data block with parity data having no preamble for recording, that is, the format used for recording regions A3 to A6. In FIG. 5A, synchronizing data S, identifying data ID are added to main data DA as necessary. Further, inner parity data IP and outer parity data OP are added to the main data. The Inner parity data IP and outer parity data OP are generated in the directions shown by arrows FA and FB respectively.

Figure 5B:
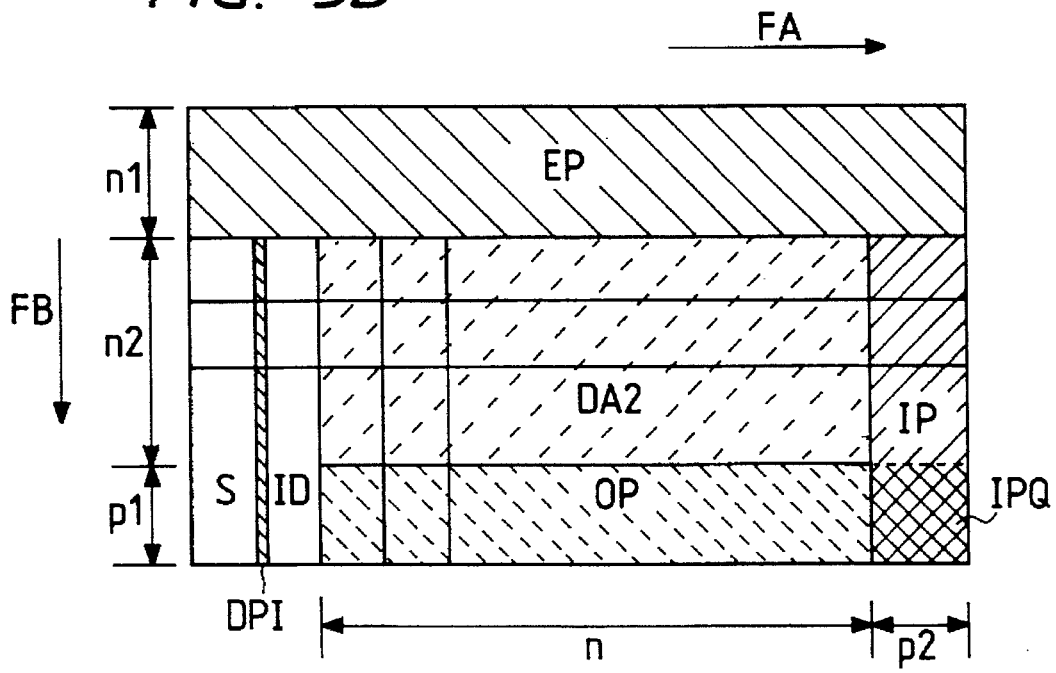
FIG. 5B is an illustration of this embodiment showing a format of a data block in the case that there is a preamble.

FIG. 5B is an illustration of this embodiment showing a format of a data block with parity data having a preamble for recording, that is, the format used for recording regions A1 and A2. In FIG. 5B, the preamble EP is provided at a top portion of data in place of the main data DA, etc. as shown in FIG. 5A. Moreover, a DPI of a format information indicative of the presence of the preamble (or IBG) in the ID portion or the main data portion except in the preamble portion is recorded.

The main data is recorded on the magnetic tape through a helical scanning together with the synchronizing data S, ID data, inner parity data IP, and outer parity data OP in either format shown in FIG. 5A or FIG. 5B serially. FIG. 4B is an illustration of this embodiment showing a serially recorded data.

The preamble is a bit train provided just before PCM data to obtain a sure lock condition in a PLL (Phase Locked Loop) circuit necessary for generating a clock for reproducing. The IBG (Inter Block Gap) is a gap between one region and the other region which enables to switch the condition between the recording and reproducing for this gap period.

The preamble has a dimension an integer times a dimension of a synchronizing data block SD extending from the synchronizing data S to the inner parity data IP. Such a format makes a circuit structure of a code generation circuit 34 for generating and attaching parity data simple because each track is formed by repeatedly recording a fixed length of data trains an integer times.

Figure 1:
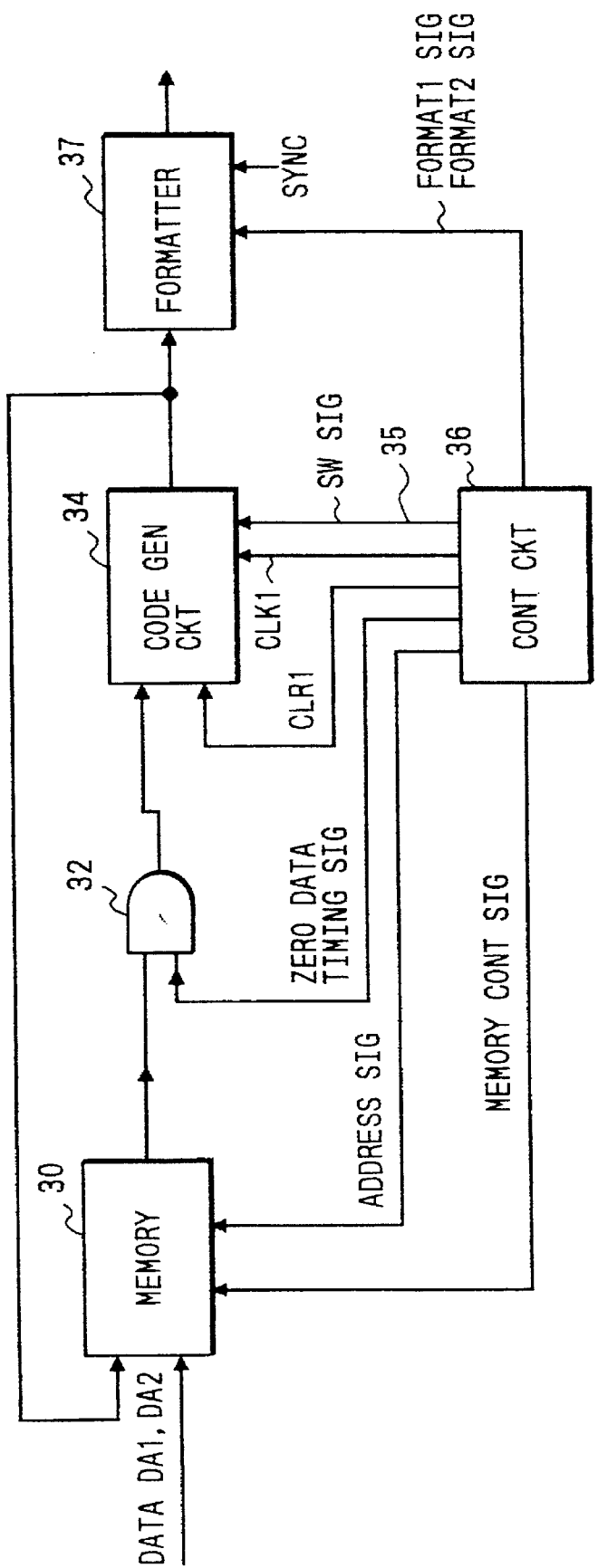
FIG. 1 is a block diagram of an embodiment showing a parity code addition circuit.
Figure 6:
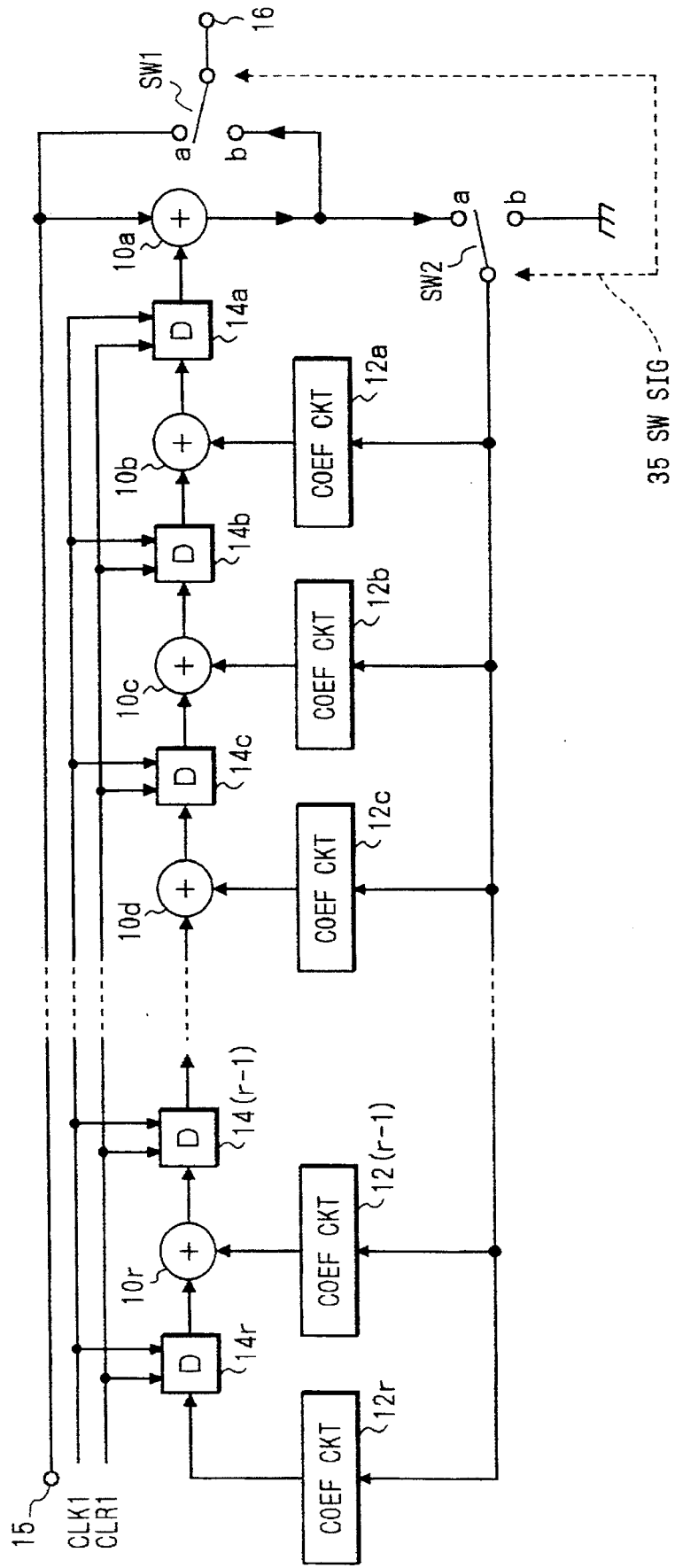
FIG. 6 is a block diagram of this embodiment showing an example of a code generation circuit 34 showing in FIG. 1.

FIG. 6 is a block diagram of this embodiment showing an example of a code generation circuit 34 shown in FIG. 1. The code generation circuit 34 generates inner parity data IP and outer parity data OP in Reed Solomon codes. In FIG. 6, at first, registers 14a to 14r for delaying an input signal are cleared in response to a clear signal CLR1. Then, data to be processed is inputted to the terminal 15. During the inputting of the data, both switches SW1 and SW2 are switched to "a" sides, so that the input data is outputted at the output terminal 16 as it is and supplied to an adder 10a. An output of the adder 10a is supplied to coefficient circuits 12a to 12r thorough the switch SW2. These coefficient circuits 12a to 12r effect coefficient operations. Outputs of the coefficient circuits 12a to 12(r–1) are supplied to adders 10b to 10r respectively. An output of the coefficient circuit 12r is supplied to a register 14r. Outputs of the adders 10b to 10r are supplied to the register 14a to 14(r–1) respectively and outputs of the registers 14a to 14r are supplied to the adders 10a to 10r. These adding and delaying operations are repeated, so that p1 of outer parity data are produced wherein p1 is a natural number.

When the input period of data has been finished, both switches SW1 and SW2 are switched to "b" sides. Then, the output of the adder 10a is connected to the output terminal 16, so that the outer parity data OP generated are outputted following the input data. During this, an arm of the switch SW2 is connected to the ground, so that the outer parity data OP are not supplied to the coefficient circuits 12a to 12r.

Figure 2:
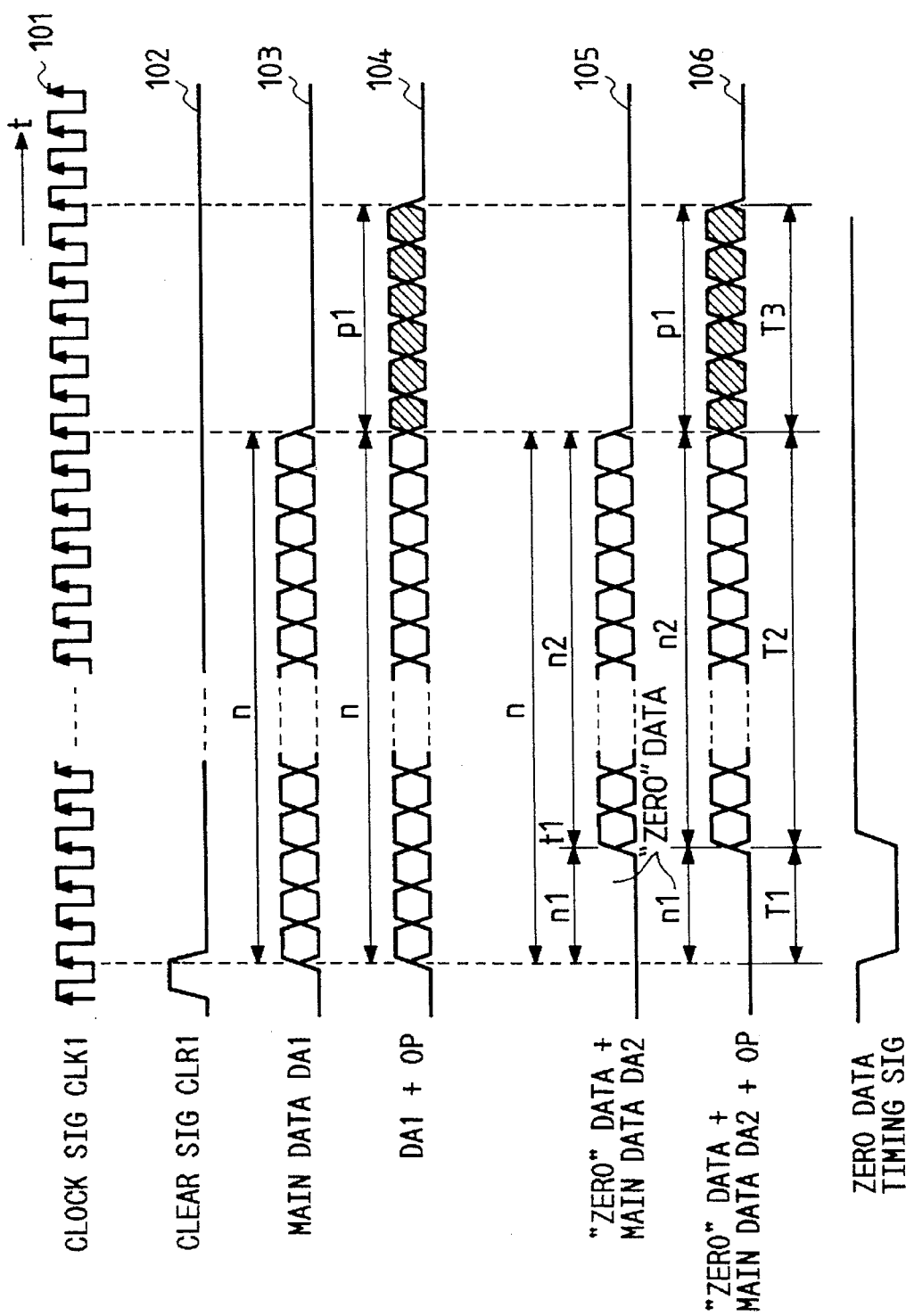
FIG. 2 is a timing chart of this embodiment showing waveforms of signals for producing a data train of the main data and parity data following the main data.

FIG. 2 is a timing chart of this embodiment showing waveforms of signals for producing a data train of the main data and parity data following the main data. When outer parity data OP is generated when the data shown in FIG. 5A is supplied, the input data to the code generation circuit 34 is shown by waveform 103 and the output data of the code generation circuit 34 is shown by waveform 104. Waveform 102 shows the clear signal CLR1 for the code generation circuit 37 and waveform 101 shows a clock signal CLK1 used for read timings of the input data and synchronizing of the code generation circuit 34. As mentioned above, the registers 14a to 14r are cleared by the clear signal CLR1 shown by waveform 102. Then, n input data, i.e., the main data DA1 shown in FIG. 5A read in the direction FB, is inputted to the code generation circuit 34 as shown by waveform 103 in response to the clock signal. The input data is outputted as it is because the switch SW2 is switched to side "a". Then, the switch SW2 is switched to the side "b", the outer parity data OP generated by the adders 10a to 10r, coefficient circuits 12a to 12r, and registers 14a to 14r is outputted at the output terminal 16.

In the case that the input data shown in FIG. 5B, i.e., the main data DA2 is inputted to the code generation circuit 34, a data length of the main data DA2 read in the direction FB is shorter than the data length of the main data DA1 read in the direction FB because data stored in the memory 30 does not include the preamble EP. Therefore, the data length of the main data DA2 should be adjusted to match the data length of the main data DA1 because repeated processing for the code generation should be provided by a simple circuit structure as mentioned above, which is one of features of this invention. Therefore, the main data DA2 is not read during the period T1 for which the preamble including n1 of data is added and at a timing t1, the main data DA2 is started to be read and inputted to the code generation circuit 34. During this period T1, the input data should be fixed to a predetermined value to ensure the parity operation, that is, "zero" data is supplied to the code generation circuit 34. Therefore, after the clear signal CLR1, n1 of "zero" data is supplied to the code generation circuit 34 and then, n2 of main data DA2 is supplied to the code generation circuit 34 wherein n1 and n2 are natural numbers. The code generation circuit 34 similarly outputs, after the clear signal CLR1, n1 of "zero" data and then, n2 of main data DA2, and further outputs P1 outer parity data. This processing should be performed in the decoding side also.

FIG. 1 is a block diagram of the embodiment showing a parity data addition circuit including a data processing circuit off this invention.

The parity data addition circuit comprises a memory 30 for storing input data such as video or audio data and outer parity data OP in accordance with an address signal, a memory control signal, an AND gate 32, having a first input responsive to an output of the memory 30 and a second input responsive to a zero data timing signal, the code generation circuit 34 for generating outer parity data OP and inner parity data IP from an output of the AND gate 32 in accordance with the clear signal CLR1 and the switching signal 35, the outer parity data OP being supplied to the memory 30, a formatter 37 for adding the preamble EP, the synchronizing data S, and the identification data ID to the main data to which the outer parity and inner parity data are attached, a control circuit 36 for generating the memory control signal, an address signal, the zero data timing signal, the clear signal CLR1, the switching signal 35, and a format 1 signal and a format 2 signal. The memory 30, the AND gate 32, and the control circuit 36 acts as the data processing circuit of this invention.

The memory 30 stores video data inputted and outer parity data in accordance with the address signal and the memory control signal from the control circuit 36. The control circuit 36 stores the video data in the memory 30 through the address signal and the memory control signal. The AND gate 32 outputs the video data from the memory 30 when the zero data timing signal indicating a logic H level. The control circuit 36 determines a logic level of the zero data timing signal. The code generation circuit 34 generates the outer parity data from video data from the AND gate 32 in accordance with the clear signal CLR1, the clock signal CLK1, and the switching signal 35. The outer parity data is supplied to the memory 30 and the control circuit 36 stores the outer parity data OP in the memory 30 through the address signal and the memory control signal. This operation is repeated n+p1 times. Then, the code generation circuit 34 generates the inner parity data IP from main data read in the direction FA via the AND gate 32 in accordance with the clear signal CLR1, the clock signal CLK1, and the switching signal 35. The main data read in the direction FA and generated inner parity data are supplied to the foramtter 37. In response to the formatting 1 signal from the control circuit 36, the formatter 37 adds the preamble EP, the synchronizing data S, and the identification data ID to the main data to which the outer parity and inner parity data are added. The control circuit 36 generates the memory control signal, address signal, zero data timing signal, clear signal CLR1, the switching signal 35, and the format 1 signal.

Operation will be described more specifically. In the case that the preamble is not added, the main data such as video data and audio data read from the memory 30 in the direction FB as shown in FIG. 5A is supplied to the code generation circuit 34 through the AND gate 32 as it is. Here, the format shown in FIGS. 5A and 5B are of recording, so that at first the memory 30 stores only data DA1 or DA2 but the control circuit 36 reads the serially stored main data DA1 and DA2 intermittently such that the main data arranged as shown in FIGS. 5A and 5B is read in direction FA or FB.

At first, in the code generation circuit 34, the registers 14a to 14r are cleared by the clear signal CLR1 and then, the code generation circuit 34 receives the main data DA1 as shown by waveform 103 and outputs the main data and outer parity data OP following the main data successively as shown by wave from 104. More specifically, p1 of Reed Solomon codes (n+p1, n, p1+1) are generated from n of data DA1 read in the direction FB by the code generation circuit 34. The outer parity data is once stored in the memory 30 every outputting of outer parity data OP as shown in FIG. 104. This operation is repeated m times to obtain all of outer parity data OP.

Then, inner parity data IP is obtained. The registers 14a to 14r of the code generation circuit 34 are cleared by the clear signal CLR1 and then, the code generation circuit 34 receives the main data DA1 read from the memory 30 in the direction FA and outputs the main data and the inner parity data IP following the main data successively. More specifically, Read Solomon codes p2 (m+p2, m, p2+1) are generated from m of data DA1 read in the direction FA from the memory 30 by the code generation circuit 34. This operation is repeated n+p1 times to obtain all of inner parity data IP. The main data or the outer parity data read in the direction FA and the inner parity data are supplied to the formatter 37 where the synchronizing data S and the identification data ID are attached thereto.

Then, operation in the case that the preamble is added will be described. At first, registers 14a to 14r of the code generation circuit 34 are cleared by the clear signal CLR1. Then, "zero" data is supplied to the code generation circuit 34 for T1 as shown in FIG. 2 using the AND gate 32. Then, the following period T2, the main data such as video data and audio data read in the direction FB from the memory 30 as shown in FIG. 5B is supplied to the code generation circuit 34 through the AND gate 32. Then, the code generation circuit 54 receives n1 of the "zero" data and n2 of the main data DA2 as shown by waveform 105 wherein n=n1+n2 and outputs the "zero" data for the period T1, the main data for the period T2, and outer parity data OP for the period T3 successively as shown by wave from 106. More specifically, Read Solomon codes p1 (n+p1, n, p1+1) are generated from n1 of "zero" data and n2 of data DA2 in the direction FB by the code generation circuit 34. The outer parity data is once stored in the memory 30. This operation is repeated m times to obtain the outer parity data OP.

Then, inner parity data IP is obtained. The registers 14a to 14r of the code generation circuit 34 are cleared by the clear signal CLR1 and then, the code generation circuit 34 receives the main data DA2 read from the memory 30 in the direction FA and outputs the main data and the inner parity data IP following the main data DA2 successively. More specifically, Read Solomon codes p2 (m+p2, m, p2+1) are generated from m of data DA2 read in the direction FB from the memory 30 by the code generation circuit 34. This operation is repeated n+p1 times to obtain the inner parity data IP. The main data or the outer parity data read in the direction FA and the inner parity data is supplied to the formatter 37 where the synchronizing data S and the Identification data ID are attached. Here, the inner parity data at the portion corresponding to the preamble portion EP results in zero, so that the operation for obtaining the inner parity for the preamble portion EP can be omitted.

As mentioned above, operational timings in the code generation circuit 34 agree between the case that the preamble is attached and the case that the preamble is not attached as shown by waveforms 104 and 106, so that the generation of the outer parity data can be obtained by the same code generation circuit 34 with the same processing timings irrespective of the presence or absence of the preamble EP.

The control circuit 36 may comprise a microprocessor and executes the above-mentioned processing.

Figure 8:
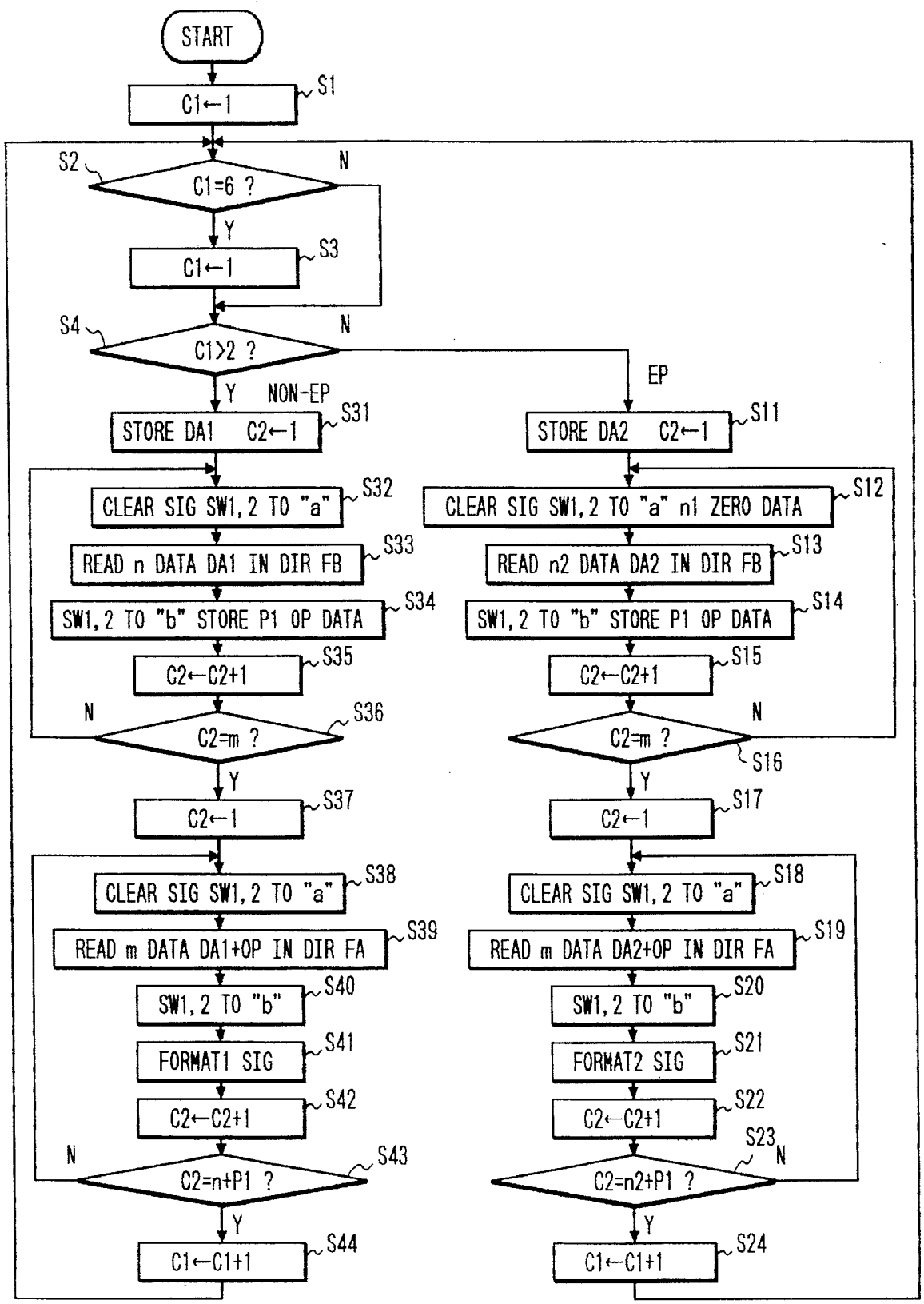
FIG. 8 shows a flow chart of this embodiment showing the operation of the control circuit 36.

FIG. 8 shows a flow chart of this embodiment showing the operation of the control circuit 36. The control circuit 36 controls the memory 30, the AND GATE 32, the code generation circuit 34, and the formatter 37 to receive data such as video and audio data, obtain the outer parity data OP and the inner parity data IP using the code generation circuit 34 and outputs data trains SD including the preamble EP, the synchronizing data, the identification data, main data DA1 or DA2, inner parity IP, and the outer parity OP as shown in FIG. 4B.

In step s1, a counter c1 is set to 1. in the following step s2, a decision is made as to whether or not the counter c1 is six (A6). If the answer is YES, the counter c1 is set to 1 in step s3. If the answer is NO, the step s3 is skipped. Here, if the counter c1 reaches to 6, this means that the data processing of one track TR, that is, data blocks A1 to A6 has been finished as shown in FIG. 4A.

In step s4, a decision is made as to whether the counter c1 is larger than 2. If the answer is NO, this means that the data block A1 or A2 is under processed, so that data size is different and the preamble should be attached.

Then, processing proceeds to step s11 to executes the processing for the case that the preamble is necessary.

In step s11, the control circuit 36 stores data DA2 in the memory 30 through the address signal and the memory control signal which allows the input data to be store in the memory 30 in this case and sets the counter c2 to 1. If the memory 30 has a large capacity, this step may replaced by a step for determining a start address and end address of the main data DA2 to be processed. In the following step s12, the control circuit 36 supplies the clear signal CLR1 to the code generation circuit 34 to clear the registers 14a to 14r and supplies the switching signal 35 to turn the switches SW1 and SW2 to "a" sides to the code generation circuit 34, and supplies the zero data timing signal to the AND gate 32 to supply "zero" data to the code generation circuit 34. That is, n1 of "zero" data is supplied to the code generation circuit 34. In the following step s13, the control circuit 36 reads out the n2 of data DA2 in the direction FB as shown in FIG. 5B from the memory 30 to supply it to the code generation circuit 34. In the following step s14, the control circuit 36 produces the switching signal 35 to turn the switches SW1 and SW2 to side "b" and stores the obtained outer parity data OP from the code generation circuit 34 in the memory 30 through the address signal and the memory control signal which allows the outer parity data to be store in the memory 30 in this case. This sequence from the step s12 to s14 is repeated m times. Therefore, in step s15, the counter c2 is increased by one and a decision is made as to whether the c2 reaches to m in step s16. If the answer is NO, this sequence is repeated. If the answer is YES, processing proceeds to step s17 and following steps to execute obtain the inner parity and output data trains as shown in FIG. 4B.

In step s17, the counter c2 is set to 1. In the following step s18, the control circuit 36 supplies the clear signal CLR1 to the code generation circuit 34 to clear the registers 14a to 14r and supplies the switching signal 35 to turn the switches SW1 and SW2 to "a" sides to the code generation circuit 34. In the following step s19, the control circuit 36 reads out the m of data DA2 and outer parity data OP in the direction FA as shown in FIG. 5B from the memory 30 to supply it to the code generation circuit 34. In the following step s20, the control circuit 36 produces the switching signal 35 to turn the switches SW1 and SW2 to "b" side In the following step s21, the control circuit 36 supplies the format 2 signal to the formatter 37 to cause the formatter to receive a data train including the main data DA2 and inner parity IP or outer parity data OP and inner parity IP and to replace the "zero" data with the preamble and to add the synchronizing data S and the identification data ID to the received data as shown in FIG. 4B.

The sequence from step s18 to s21 should be repeated n2+p1 times, so that the counter c2 is increased by one in step s22 and a decision is made as to whether or not c2=n2+p1 in step s23. If this sequence has been repeated n2+p1 times, processing proceeds to step s24 where the counter c1 is increase by one to process all data blocks A1 to A6. Then, processing returns to step s2.

In step s4, if the answer is YES, this means that the data block A3, A4, A5, or A6 is under processed, so that data size of the main data DA1 is different from the data size DA2 and the preamble is not attached.

Then, processing proceeds to step s31 to executes the processing for the case that the preamble is unnecessary.

In step s31, tile control circuit 38 stores data DA1 in the memory 30 through the address signal and the memory control signal which allows the input data to be store in the memory 30 in this case and sets the counter c2 to 1. In the following step s32, the control circuit 36 supplies the clear signal CLR1 to the code generation circuit 34 to clear the registers 14a to 14r and supplies the switching signal 35 to turn the switches SW1 and SW2 to "a" sides to the code generation circuit 34. In the following step s33, the control circuit 36 reads out the n of data DA1 in the direction FB as shown in FIG. 5B from the memory 30 to supply it to the code generation circuit 34. In the following step s34, the control circuit 36 produces the switching signal 35 to turn the switches SW1 and SW2 to "b" side and stores the obtained outer parity data OP from the code generation circuit 34 in the memory 30 through the address signal and the memory control signal which allows the outer parity data to be store in the memory 30 in this case. This sequence from the step s32 to s34 is repeated m times. Therefore, in step s35, the counter c2 is increased by one and a decision is made as to whether the c2 reaches to m. If the answer is NO, this sequence is repeated. If the answer is YES, processing proceeds to step s37 and following steps to execute obtain the inner parity and output data trains as shown in FIG. 4B.

In step s37, the counter c2 is set to 1. In the following step s38, the control circuit 36 supplies the clear signal CLR1 to the code generation circuit 34 to clear the registers 14a to 14r and supplies the switching signal 35 to turn the switches SW1 and SW2 to "a" sides to the code generation circuit 34. In the following step s39, the control circuit 36 reads out the m of data DA1 and outer parity data OP in the direction FA as shown in FIG. 5A to supply it to the code generation circuit 84. In the following step s40, the control circuit 36 produces the switching signal 35 to turn the switches SW1 and SW2 to "b" side. In the following step s41, the control circuit 36 supplies the format 1 signal to the formatter 37 to cause the formatter 37 to receive a data train including the main data DA1 and inner parity IP or outer parity data OP and inner parity IP and attach the synchronizing data S and the identification data ID to the received data as shown in FIG. 4B.

The sequence from step s38 to s41 should be repeated n+p1 times, so that the counter c2 is increased by one in step s42 and a decision is made as to whether or not c2=n+p1 in step s43. If this sequence has been repeated n+p1 times, processing proceeds to step s44 where the counter c1 is increased by one to process all data blocks A1 to A6. Then, processing returns to step s2.

Figure 9:
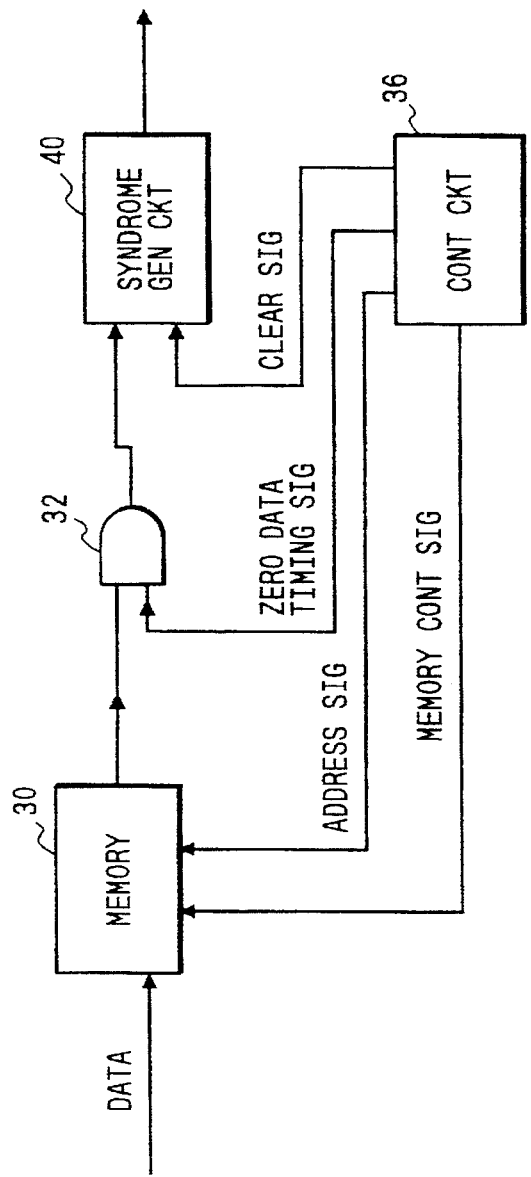
FIG. 9 is a block diagram of a decoding circuit having a syndrome generation circuit.

Another example of this invention of the data processing circuit cooperation with a syndrome generation circuit will be described. FIG. 9 is a block diagram of decoding circuit having a syndrome generation circuit. The decoding circuit of this embodiment has a similar circuit as the coding circuit shown in FIG. 1. A difference is in that the code generation circuit 34 is replaced with & syndrome generation circuit 40.

Figure 7:
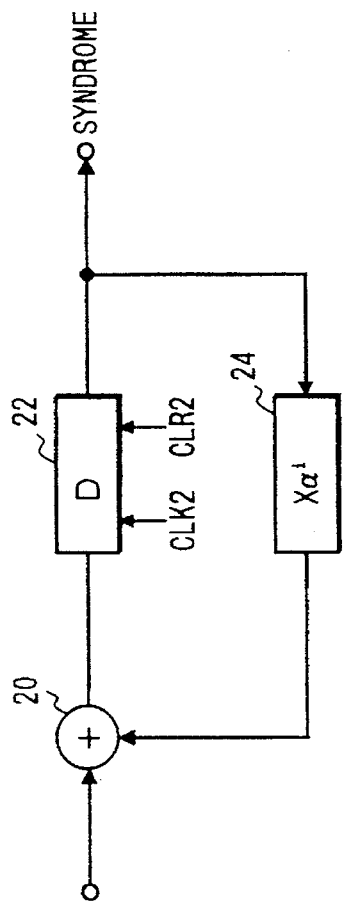
FIG. 7 is a block diagram of this embodiment of the syndrome generation circuit 40.

FIG. 7 is a block diagram of this embodiment of the syndrome generation circuit 40. The syndrome generation circuit 40 comprises an adder 20 having first and second input, the first input receiving input data, i.e., the main data and inner parity data and outer parity data to be decoded where the preamble is removed, a register 22 for delaying an output of the adder 20 in response to a clock signal CLK2, the register 22 being reset by a clear signal CLR2 and controlled by a clock signal CLK2, and a multiplier 24, having a coefficient generator generating coefficient data, for multiplying an output of the register 22 with the coefficient data, the second input receiving an output of the multiplier 24.

Figure 3:
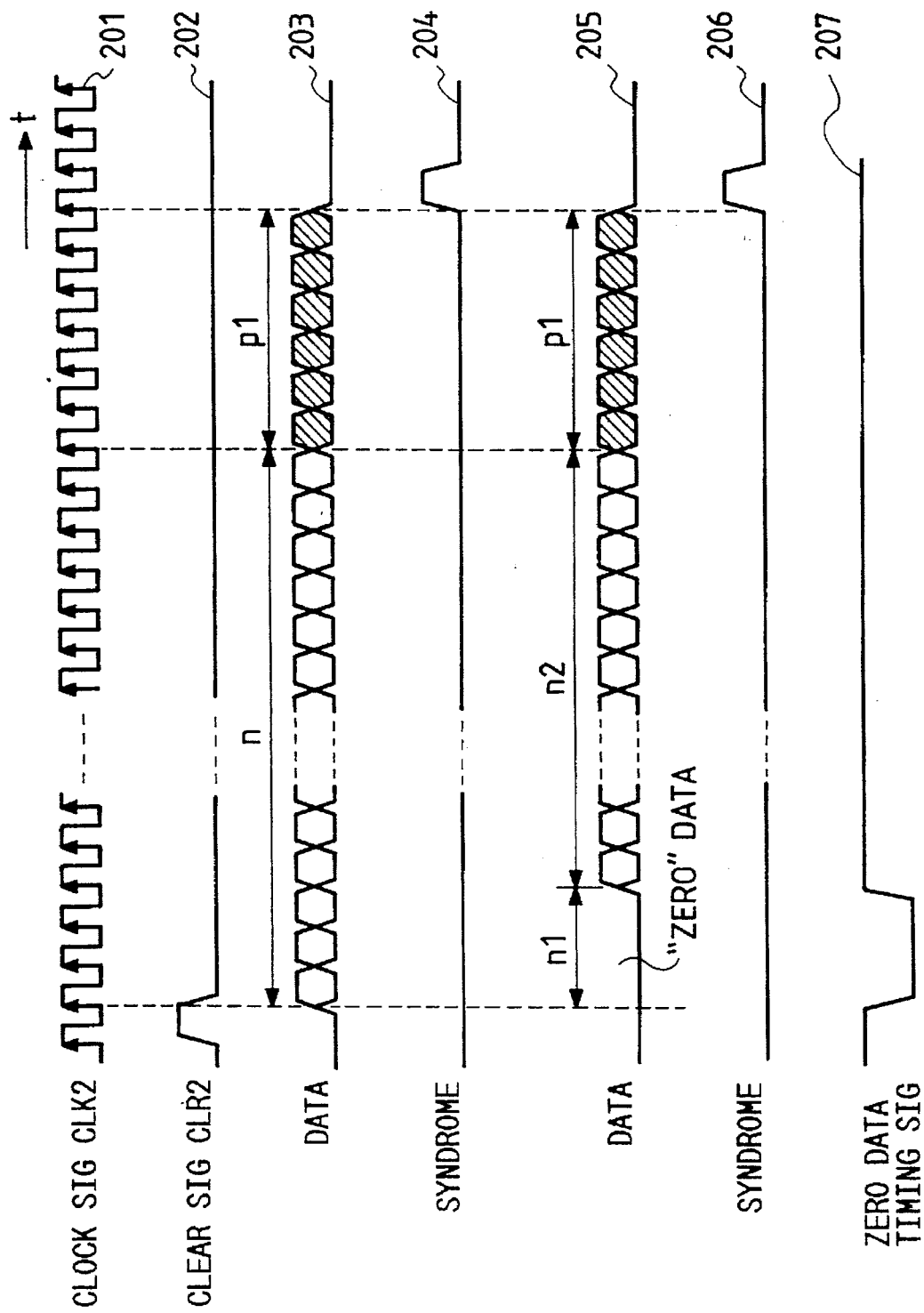
FIG. 3 is a timing chart of this embodiment showing waveforms of signals for generation of a syndrome from a data train of the main data and parity data following the main data.

FIG. 3 is a timing chart of this embodiment showing waveforms of signals for generation of a syndrome from a data train of the main data and parity data following the main data.

An operation in the case that the pro&ruble EP is not included in the data will be described. Data outputted from the memory 30 is supplied to the syndrome generation circuit 40 through the AND gate 32 as it is. The syndrome generation circuit 40 generates the syndrome as shown by waveforms 202, 203, and 204. More specifically, with respect to the inner parity data IP, a syndrome is generated for a code word including m+p2 symbols. This operation is repeated n+p1 times. On the other hand, with respect to the outer parity data OP, a syndrome is generated for a code word including n+p1 symbols. This operation is repeated m times.

An operation in the case that the preamble EP is included in the data will be described. Data outputted from the memory 30 is supplied to the syndrome generation circuit 40 through the AND gate 32 which adds "zero" data to a data train read from the memory 30 in response to a zero data timing signal as shown by waveforms 205 and 207. The syndrome generation circuit 40 generates the syndrome as shown by waveforms 206.

More specifically, n1 of "zero" data and n2 of data where n=n1+n2 is supplied to the syndrome generation circuit 40.

With respect to the inner parity data IP, a syndrome is generated for a code word including m+p2 symbols. This operation is repeated (n1+n2+p1) times. However, this n1-times operations do not require actual calculation because n1 data is "zero" data. On the other hand, with respect to the outer parity data OP, a syndrome is generated for a code word including n+p2 symbols including n1 "zero" data. This operation is repeated m times.

As mentioned above, operational timings in the syndrome generation circuit 40 agree between the case that the preamble is attached and the case that the preamble is not attached as shown by waveforms 203 and 205, so that the generation of the syndrome can be obtained by the same syndrome generation circuit 40 with the same processing timings irrespective of the presence or absence of the preamble EP. In the case of an error correction circuit (not shown) which executes an error correction in accordance with the syndrome, this is applicable. That is, the error correction can be obtained by the same error correction circuit with the same processing timings irrespective of the presence or absence of the preamble EP.

The above-mentioned embodiment is described assuming that there are two cases that the preamble is present and absent. However, this invention is applicable to data processing where the number of symbols to which error correction code is attached varies. In this case, q dummy data is added to the data where q is a difference from a predetermined maximum number of symbols.

In the above-mentioned embodiment, "zero" data is added only to the data DA2. However, it is also possible that "zero" data is added to both data DA1 and DA2 where the number of "zero" data is different each other.

Moreover, in the above-mentioned embodiment, the "zero" data as dummy data is attached. However, other predetermined dummy data can be used.

Here, when the dummy data is "zero", a portion of calculation operation can be omitted.

As shown in FIG. 5B, the inner parity IPQ for the outer parity data OP has an effect of error correction in both directions FA and FB.

The number of symbols, n, n1, n2, p1, m, p2, and q which are natural numbers can be set adaptively.

Moreover, the data format shown in FIGS. 5A and 5B can be modified. For example, in FIG. 5B, the preamble EP is commonly used for IBG. However, it is also possible to provide some synchronizing blocks as IBG and following synchronizing blocks as preamble. Further, the IBG can be provided in place of the preamble and it is also possible to provide both preamble and IBG.

The above-mentioned embodiment is applied to the data processing using the tape medium. However, this invention is applicable to other medium such as a disc medium. Further, in the above-mentioned embodiment, the data includes the video data and audio data. However, this invention is also applicable to other combinations of two kinds of data.

In the above-mentioned embodiment, Reed Solomon codes are used. However, other error check codes can be used. In that case, the code generation circuit 34 and the syndrome generation circuit 40 may be modified as necessary.

As mentioned above, a method of generating codes of this invention for error checking from a first and second types of data trains, namely, main data DA2 and DA1 read in the direction FB respectively, the first type of data train having n2+p1 symbols, the second type of data trains having n (n1+n2)+p1 symbols, comprising the steps of: generating n1 predetermined dummy data; and attaching the n1 predetermined dummy data to the first types of data train is described. The method may further comprises the step of: replacing the n1 predetermined dummy data with preamble data (EP).

In the above-mentioned embodiment, the operation of generating predetermined dummy data, attaching the predetermined dummy data to the data train having a fewer number of data was described with respect to the main data is read in the direction FB. However, this operation is applicable to the case where there are two lengths of data trains when the main data is read in the direction FA.

Moreover, a code generating circuit for error checking from a first and second types of data trains, namely, main data DA2 and DA1 read in the direction FB respectively, the first type of data trains having n2+p1 symbols, second type of data trains having n (n1+n2)+p1 symbols, the first type of data train being supplied in a first mode, the second type of data train being supplied in a second mode, is provided, which comprises a data generating circuit including the AND gate 32, and the control circuit 36, for generating n1 predetermined dummy data in the first mode, namely, the mode when the preamble is present; and a data processing circuit including the memory 30, the AND gate 32, and the control circuit 36 for outputting the second type of data train serially in the second mode, namely, the mode when the preamble is absent, for attaching the n1 predetermined dummy data to the first types of data train, and outputting the first type of data train and the n1 predetermined dummy data serially in the first mode.

Modification will be described. FIG. 10 is a timing chart of a modification of this embodiment showing waveforms of signals for producing a data train of the main data and parity data following the main data. This processing is similar to the operation described with the timing chart shown in FIG. 2. However, in this modification, zero data is added to both data trains obtained from the main data DA1 and DA2 such that a first data length of the first types of data train and the second dummy data being equal to a second data length of the second type of data train and second dummy data. In this case, the processing in step s32 shown in FIG. 8 is modified as shown in step s12. That is, in step s32, n0 of "zero" data is outputted and in step s12, n1' of "zero" data is outputted as shown in FIG. 10.

Therefore, a method of generating codes of this invention for error checking from a first and second types of data trains, namely, main data DA2 and DA1 read in the direction FB respectively, the first type of data trains having n2+p1 symbols, the second type of data trains having n (n1+n2)+p1 symbols, comprising the steps of: comprising the steps of: generating (n') of first dummy data; generating (n0) of second dummy data; attaching the first dummy data to the first type of data train; and attaching the second dummy data to the second types of data train, the first and second dummy data being generated such that a first data length of the first types of data train and the second dummy data being equal to a second data length of the second type of data train and second dummy data is also disclosed.

Therefore, a code generating circuit for error checking from a first and second types of data trains, namely, main data DA2 and DA1 read in the direction FB respectively, the first type of data train having n2+p1 symbols, the second type of data trains having n (n1+n2)+p1 symbols, the first type of data train being supplied in a first mode, the second type of data train being supplied in a second mode, is provided, which comprises: a first data generation circuit, including the memory 30, the AND gate 32, and the control circuit 36, for generating first dummy data in the first mode; a second data generation circuit, including the memory 30, the AND gate 32, and the control circuit 36, for generating second dummy data in the second mode; a data processing circuit, including the AND gate 32 and the control circuit 36, for attaching the first dummy data to the first type of data train and outputting the first type of data train with the first dummy data in the first mode; and a data processing circuit, including the AND gate 32 and the control circuit 36, for attaching the second dummy data to the second types of data train, the first and second dummy data being generated such that a first data length of the first types of data train and the second dummy data being equal to a second data length of the second type of data train and second dummy data.

What is claimed is:

1. A method of generating codes for error checking from first and second types of data trains, wherein said first type of data train includes m symbols, said second type of data train includes n symbols, m and n are natural numbers, and m<n, said method comprising the steps of:

generating n-m predetermined dummy data;

attaching said n-m predetermined dummy data to said first type of data train to generate a modified data train; and recording said modified data train, which includes said dummy data on a recording medium, wherein a recording region of said recording medium is provided that corresponds to said dummy data.

2. A method of generating codes for error checking from first and second types of data trains, wherein said first type of data includes m symbols, said second type of data includes n symbols, and m and n are natural numbers and different each other, said method comprising the steps of:

(a) generating first dummy data;
(b) generating second dummy data;
(c) attaching said first dummy data to said first type of data train to generate a first modified data train;
(d) attaching said second dummy data to said second type of data train to generate a second modified data train, wherein said first and second dummy data are generated such that a first data length of said first modified data train, which includes said first type of data train and said first dummy data, is equal to a second data length of said second modified data train, which includes said second type of data train and second dummy data; and recording said first and second modified data trains on a recording medium, wherein recording regions of said recording medium are provided that correspond to said first and second dummy data.

3. A code generating circuit for error checking from first and second types of data trains, wherein said first type of data train includes m symbols, said second type of data train includes n symbols, m and n are natural numbers with m<n, said first type of data train is supplied in a first mode, and said second type of data train is supplied in a second mode, said code generating circuit comprising:

data generating means for generating n-m dummy data in said first mode; and data processing means for outputting said second type of data train serially in said second mode, for attaching said n-m dummy data to said first type of data train, and outputting said first type of data train and said n-m dummy data serially in said first mode as a modified data train; and recording means for recording said second type of data train on a recording medium in said second mode and for recording said modified data train, which includes said n-m dummy data, on said recording medium in said first mode;

wherein a recording region of said recording medium is provided in said first mode that corresponds to said n-m dummy data.

4. A code generating circuit for error checking from first and second types of data trains, wherein said first type of data train includes m symbols, said second type of data train includes n symbols, m and n are natural numbers and different each other, said first type of data train is supplied in a first mode, and said second type of data train being supplied in a second mode, said code generating circuit comprising:

(a) first data generation means for generating first dummy data in said first mode;

(b) second data generation means for generating second dummy data in said second mode;

(c) data processing means for attaching said first dummy data to said first type of data train and outputting said first type of data train with said first dummy data in said first mode to generate a first modified data train; and (d) data processing means for attaching said second dummy data to said second type of data train in said second mode to generate a second modified data train, wherein said first and second dummy data is generated such that a first data length of said first modified data train, which includes said first type of data train and said first dummy data, is equal to a second data length of said second modified data train, which includes said second type of data train and second dummy data; and (e) recording means for recording said first and second modified data trains on a recording medium, wherein recording regions of said recording medium are provided that correspond to said first and second dummy data.

5. A method of generating codes as claimed in claim 1, further comprising the step of:

replacing said predetermined dummy data with predetermined data.

* * * * *